United States Patent
Nah et al.

(10) Patent No.: US 11,158,781 B2
(45) Date of Patent: Oct. 26, 2021

(54) PERMANENT WAFER HANDLERS WITH THROUGH SILICON VIAS FOR THERMALIZATION AND QUBIT MODIFICATION

(71) Applicant: INTERNATIONAL BUSINESS MACHINES CORPORATION, Armonk, NY (US)

(72) Inventors: Jae-Woong Nah, Closter, NJ (US); Li-Wen Hung, Mahopac, NY (US); Eric P. Lewandowski, White Plains, NY (US); Adinath S. Narasgond, Yonkers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 111 days.

(21) Appl. No.: 16/698,171

(22) Filed: Nov. 27, 2019

(65) Prior Publication Data

US 2021/0159382 A1    May 27, 2021

(51) Int. Cl.
| | |
|---|---|
| *H01L 39/06* | (2006.01) |
| *G06N 10/00* | (2019.01) |
| *H01L 27/18* | (2006.01) |
| *H01L 39/04* | (2006.01) |
| *H01L 39/24* | (2006.01) |

(52) U.S. Cl.
CPC ............ *H01L 39/06* (2013.01); *G06N 10/00* (2019.01); *H01L 27/18* (2013.01); *H01L 39/04* (2013.01); *H01L 39/24* (2013.01)

(58) Field of Classification Search
CPC ......... H01L 39/06; H01L 39/24; H01L 27/18; H01L 39/04
See application file for complete search history.

(56) References Cited

U.S. PATENT DOCUMENTS

| | | |
|---|---|---|
| 7,932,515 B2 | 4/2011 | Bunyk |
| 8,242,604 B2 | 8/2012 | Volant et al. |
| 9,971,970 B1 | 5/2018 | Rigetti et al. |
| (Continued) | | |

FOREIGN PATENT DOCUMENTS

| | | |
|---|---|---|
| GB | 2211662 A | 7/1989 |
| WO | 2018052399 A1 | 3/2018 |
| WO | 2018212041 A1 | 11/2018 |

OTHER PUBLICATIONS

Rosenberg et al., "3D integration and packaging for solid-state qubits", arXiv:1906.11146v2 [quant-ph] Jul. 24, 2019.
(Continued)

*Primary Examiner* — Dung A. Le
(74) *Attorney, Agent, or Firm* — Henry J. Daley; Venable LLP (57) ABSTRACT

A quantum device includes a qubit chip having a plurality of qubits and an interposer attached to and electrically connected to the qubit chip. The device also includes a substrate handler attached to one side of the qubit chip or to one side of the interposer, or both so as to be thermally in contact with the qubit chip or the interposer, or both. The substrate handler includes a plurality of vias, at least a portion of plurality of vias being filled with a non-superconducting material, the non-superconducting material being selected to dissipate heat generated in the qubit chip, the interposer or both.

17 Claims, 9 Drawing Sheets

(56) References Cited

U.S. PATENT DOCUMENTS

| | | | |
|---|---|---|---|
| 10,068,181 B1 | 9/2018 | Rigetti et al. | |
| 10,121,754 B2 | 11/2018 | Oliver et al. | |
| 10,134,972 B2 | 11/2018 | Oliver et al. | |
| 10,157,842 B1 | 12/2018 | Abraham et al. | |
| 10,242,968 B2 | 3/2019 | Das et al. | |
| 2013/0258595 A1* | 10/2013 | Tuckerman | H01L 23/445 |
| | | | 361/701 |
| 2017/0373044 A1 | 12/2017 | Das et al. | |
| 2018/0102470 A1 | 4/2018 | Das et al. | |
| 2019/0042964 A1* | 2/2019 | Elsherbini | H01L 29/66977 |
| 2019/0080983 A1 | 3/2019 | Loney et al. | |
| 2020/0152540 A1* | 5/2020 | Nah | G06N 10/00 |

OTHER PUBLICATIONS

Rosenberg et al., "3D integrated superconducting qubits", npj Quantum Information, 2017, 42.

Vahidpour et al,. "Superconducting Through-Silicon Vias for Quantum Integrated Circuit", arXiv:1708.02226v1 [physics.app-ph] Aug. 7, 2017.

PCT/2020/083203 International Search Report dated Apr. 22, 2021.

PCT/2020/083203 Written Opinion dated Apr. 22, 2021.

\* cited by examiner

PERMANENT WAFER HANDLERS WITH THROUGH SILICON VIAS FOR THERMALIZATION AND QUBIT MODIFICATION

BACKGROUND

The currently claimed embodiments of the present invention relate to superconducting quantum mechanical devices, and more specifically, to a quantum mechanical device having a permanent substrate handler and a method of making the same.

Quantum computation is based on the reliable control of quantum bits (referred to herein throughout as qubits). The fundamental operations required to realize quantum algorithms are a set of single-qubit operations and two-qubit operations which establish correlations between two separate quantum bits. The realization of high fidelity two-qubit operations may be desirable both for reaching the error threshold for quantum computation and for reaching reliable quantum simulations.

The superconducting quantum processor (having one or more superconducting qubits) includes superconducting metals (e.g., Al, Nb, etc.) on an insulating substrate (e.g., Si or high resistivity Si, $Al_2O_3$, etc.). The superconducting quantum processor is typically a planar two-dimensional lattice structure of individual qubits linked by a coupler in various lattice symmetry (for example, square, hexagonal, etc.), and a readout structure located on a flip-chip. The couplers can be made of a capacitor, a resonator, a coil or any microwave component that provides a coupling between qubits.

The flip-chip method may be needed for a relatively large number of qubits in a given qubit chip area. A qubit chip with a relatively large size (for example, a size greater than 20 mm by 20 mm) provides benefits in coherence when compared to connection of multi-chips with a relatively smaller size. The implementation of a relatively large number of qubits would require a qubit chip with a relatively larger size (for example, greater than 20 mm by 20 mm). However, a relatively larger (for example, a size greater than 20 mm by 20 mm) would need vias to break the box mode. Conventionally, forming vias in a qubit chip substrate requires thinning the substrate (e.g., a silicon substrate). The thinning of the substrate and the presence of vias can render the substrate weak and fragile. In conventional packaging methods, in order to alleviate the above problem, a plain support structure or a plain substrate handler (e.g., made of glass, silicon, etc.) is used to strengthen the substrate during manufacture. However, these conventional packaging methods require that the plain substrate handler be removed (i.e., de-bonded) in the final structure. However, removing the substrate handler in the final may create problems in the final structure including damaging the final structure such as damaging the substrate having the qubits, the qubits themselves and/or the interposer and/or other components during the removal procedure.

SUMMARY

An aspect of the present invention is to provide a quantum device. The quantum device includes a qubit chip comprising a plurality of qubits and an interposer attached to and electrically connected to the qubit chip. The quantum device further includes a substrate handler attached to one side of the qubit chip or to one side of the interposer, or both so as to be thermally in contact with the qubit chip or the interposer, or both. The substrate handler includes a plurality of vias. At least a portion of plurality of vias are filled with a non-superconducting material, the non-superconducting material being selected to dissipate heat generated in the qubit chip, the interposer or both.

In an embodiment, the interposer is attached to and electrically connected to the qubit chip using solder bumps. In an embodiment, the quantum device further includes a bonding material. The substrate handler is attached to the one side of the qubit chip or to the one side of the interposer, or both using the bonding material. In an embodiment, the bonding material is an adhesive bonding material or a metal or an oxide bonding. In an embodiment, the bonding material can be polyimide, benzocyclobutene (BCB), acrylic, Al—Al bonding, In—In bonding, Sn—Sn boding, Au—Sn bonding, Au—In bonding, and Sn—In bonding, or any combination thereof.

In an embodiment, the quantum device further includes a plurality of thermally conductive studs configured and arranged to thermally connect the substrate handler to the one side of the qubit chip or to the one side of the interposer, or both.

In an embodiment, the quantum device further includes a superconducting material. The qubit chip and the interposer comprise a plurality of vias, at least a portion of the vias being filled with the superconducting material. In an embodiment, a back side of the qubit chip opposite to a side having the plurality of qubits has a layer of the superconducting material and a back side of the interposer opposite to a side of the interposer attached to and electrically connected to the qubit chip has a layer of the superconducting material.

In an embodiment, the substrate handler has a plurality of vias, a portion of the plurality of vias being filled with superconducting material and at least one of the plurality of vias being substantially empty to operate as at least one window-via. In an embodiment, the at least one window-via is located on a back side of a location of a qubit of the plurality of qubits so as to enable a laser beam to be transmitted through the at least one window-via to controllably remove a metal layer connected to the qubit and change a capacitance of the qubit. In an embodiment, the interposer and the substrate handler comprise at least one window-via that traverses both the interposer and the substrate handler so as to enable a laser beam to be transmitted therethrough to a frontside of the qubit to modify the qubit. In an embodiment, the interposer and the substrate handler include at least one window-via that traverses both the interposer and the substrate handler so as to enable a plasma to be transmitted therethrough to the qubit chip.

In an embodiment, the interposer includes a plurality of vias, a first portion of the plurality of vias is filled with superconducting material for ground connection and a second portion of the plurality of vias is filled with superconducting material for signal transmission.

In an embodiment, the quantum device also includes a first heat sink thermally and mechanically in contact with the substrate handler, the heat sink being configured to further dissipate heat dissipated by the substrate handler. In an embodiment, the quantum device further includes an organic substrate attached to and electrically connected to the interposer using a plurality of solder bumps. In an embodiment, the first heat sink is further attached to the organic substrate.

Another aspect of the present invention is to provide a method of making a quantum device. The method includes providing a first substrate handler; providing a qubit chip substrate; forming a plurality of vias through the first substrate handler; filling the plurality of vias with non-superconducting thermally conducting material; forming a plurality of thermally conductive studs on one side of the first substrate handler; forming a plurality of vias in a first face of the qubit chip substrate; filling the plurality of vias with a superconducting material; and bonding the first face of the qubit chip substrate to the one side of the first substrate handler having the thermally conductive studs.

In an embodiment, the method further includes grinding a second face of the qubit chip substrate, the second face being opposite to the first face until reaching the plurality of vias in the first face of the qubit chip substrate; forming capacitors and bus lines on the ground second face using a superconducting material; and forming a plurality of qubits on the ground second face of the qubit chip substrate and connecting the plurality of qubits to the capacitors and bus lines to obtain a qubit chip support structure.

In an embodiment, bonding the first face of the qubit chip substrate to the one side of the substrate handler having the thermally conductive studs includes bonding using a polymer material, a metal bonding, or an oxide bonding.

In an embodiment, the method also includes providing a second substrate handler; providing an interposer substrate; forming a plurality of via through the second substrate handler; filling the plurality of via with non-superconducting thermally conducting material; forming a plurality of thermally conductive studs on one side of the second substrate handler; forming a plurality of via in a first face of the interposer substrate; filling the plurality of via with a superconducting material; and bonding the first face of the interposer substrate to the one side of the second substrate handler having the thermally conductive studs.

In an embodiment, the method further includes grinding a second face of the interposer substrate, the second face being opposite to the first face until reaching the plurality of via in the first face of the interposer substrate; forming readout resonators, capacitive coupled lines, and drive lines using a superconducting material; and applying solder bumps on the ground second face of the interposer substrate to obtain an interposer support structure.

In an embodiment, the method includes contacting a side of the qubit chip support structure having the qubits with a side of the interposer support structure having the solder bumps. In an embodiment, prior to contacting the side of the qubit chip support structure having the plurality of qubits with the side of the interposer support structure having the solder bumps, dicing the qubit support structure having the plurality of qubits into a plurality of qubit chips. In an embodiment, the method further includes contacting each of the plurality of qubit chips having the qubits with the side of the interposer support structure having the solder bumps. In an embodiment, the method further includes bonding the interposer support structure to an organic substrate.

The present method and quantum device have many benefits including a relative ease of implementation as well as eliminating unnecessary conventional steps such as removing substrate handler (i.e., de-bonding the substrate handler) in the final structure. In fact, to the contrary, the substrate handler of the present invention remains in the final structure and can provide additional rigidity to the structure while acting as a heat dissipator.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1:
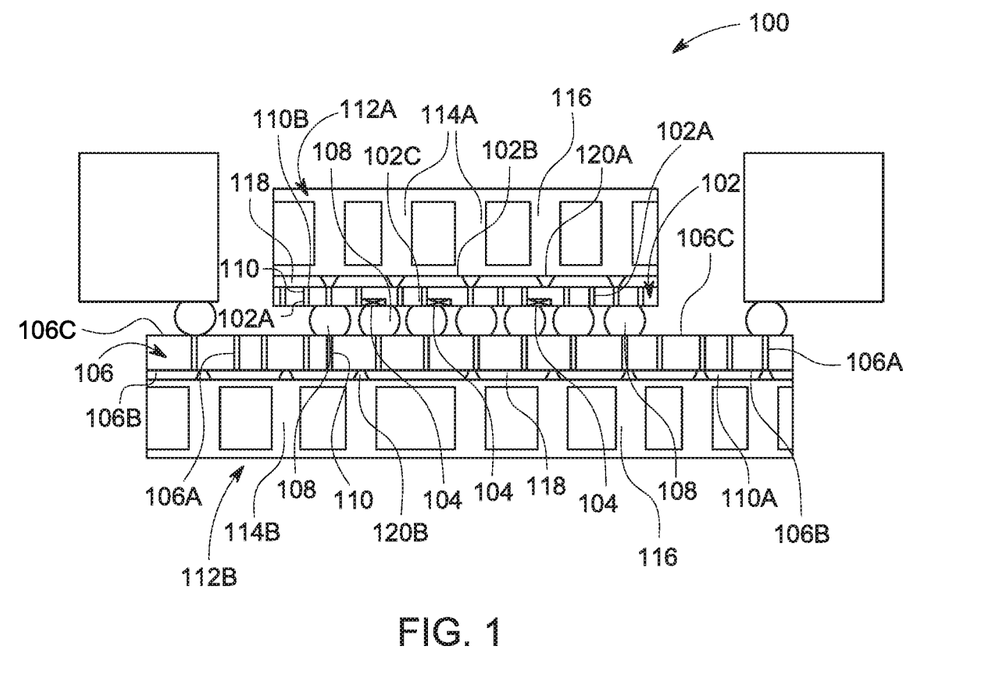
FIG. 1 is a schematic cross-section view of a quantum mechanical device, according to an embodiment of the present invention.

FIG. 1 is a schematic cross-section view of a quantum mechanical device 100, according to an embodiment of the present invention. The quantum mechanical device 100 includes a qubit chip 102 including a plurality of qubits 104. In an embodiment, the plurality of qubits can be, for example, superconducting qubits such as transmon qubits, xmon qubits, fluxonium qubits, etc. The term "qubit chip" is used herein broadly to mean a substrate including two or more qubits.

The quantum mechanical device 100 also includes an interposer 106 attached to and electrically connected to the qubit chip 102. In an embodiment, the interposer 106 is attached to and electrically connected to the qubit chip 102 using solder bumps 108.

In an embodiment, the quantum mechanical device 100 also includes superconducting material 110. In an embodiment, the qubit chip 102 has a plurality of vias 102A and the interposer has a plurality of vias 106A. In an embodiment, at least a portion of vias 102A and/or 106A are filled with the superconducting material 110. In an embodiment, the interposer 106 has a first portion of the plurality of vias 106A filled with superconducting material 110 for ground connection and a second portion of the plurality of vias 106A filled with superconducting material 110 for signal transmission.

In an embodiment, the vias 102A of the qubit chip 102 can have a size ranging from 3 µm to 100 µm in diameter for the circle type and ring width of 3 um to 100 µm for the annular type. In an embodiment, the vias 106A of the interposer 106 can also have a size ranging from 3 µm to 100 µm in diameter for the circle type and ring width of 3 um to 100 µm for the annular type.

In an embodiment, a back side 102B of the qubit chip 102 opposite to a front side 102C of the qubit chip 102 having the plurality of qubits 104 has a layer 110B of the superconducting material 110. In an embodiment, a back side 106B of the interposer 106 opposite to a front side 106C of the interposer 106 attached to and electrically connected to the qubit chip 102 has a layer 110A of the superconducting material 110.

The quantum mechanical device 100 also includes a substrate handler 112A, 112B attached to one side of the qubit chip 102 or attached to one side of the interposer 106, or both. For example, in an embodiment, the substrate handler 112A can be attached to and thermally in contact with the back side 102B of the qubit chip 102 and the substrate handler 112B can be attached to and thermally in contact with the back side 106B of the interposer 106. In an embodiment, the substrate handler 112B can be made of glass, silicon, etc.

In an embodiment, the substrate handler 112A includes a plurality of vias 114A and the substrate handler 112B includes a plurality of vias 114B. In an embodiment, at least a portion of the plurality of vias 114A and/or 114B are filled with a non-superconducting material 116. The non-superconducting material 116 can be selected to dissipate heat generated in the qubit chip 102, the interposer 106 or both. In an embodiment, the vias 114A, 114B in the substrate handlers 112A, 112B, respectively, have a size ranging from 30 µm to 1 mm in diameter for the circle type and ring width of 30 µm to 1 mm for the annular type. In an embodiment, the vias 114A, 114B of the substrate handlers 112A, 112B, respectively, have larger size (e.g., about ten times larger) than the vias 102A of the qubit chip 102 or the vias 106A of the interposer 106.

In an embodiment, the quantum mechanical device 100 further includes a bonding material 118. The substrate handler 112A, 112B is attached to the back side 102B of the qubit chip 102 or to the back side 106B of the interposer 106, or both using the bonding material 118. For example, the substrate handler 112A is attached to the back side 102B of the qubit chip 102 using the bonding material 118 and the substrate handler 112B is attached to the back side 106B of the interposer 106 using the bonding material 118. In an embodiment, the bonding material 118 is an adhesive bonding material or a metal or an oxide bonding. In an embodiment, the bonding material 118 can be any of polyimide, benzocyclobutene (BCB), acrylic, Al—Al bonding, In—In bonding, Sn—Sn boding, Au—Sn bonding, Au—In bonding, and Sn—In bonding, or any combination of two or more thereof.

In an embodiment, the quantum mechanical device 100 further includes a plurality of thermally conductive studs 120A, 120B configured and arranged to thermally connect the substrate handler 112A, 112B to the back side 102B of the qubit chip 102 or to the back side 106B of the interposer 106, or both. For example, thermally conductive studs 120A are configured and arranged to thermally connect the substrate handler 112A to the back side 102B of the qubit chip 102, and thermally conductive studs 120B are configured and arranged to thermally connect the substrate handler 112B to the back side 106B of the interposer 106. In an embodiment, the thermally conductive studs 120A, 120B can be any thermally conductive material including, but not limited to, Cu, Au, electroplated Cu, electroplated Au, electroplated Re or any combination thereof, and/or solder materials such as Sn, In, etc.

Figure 2:
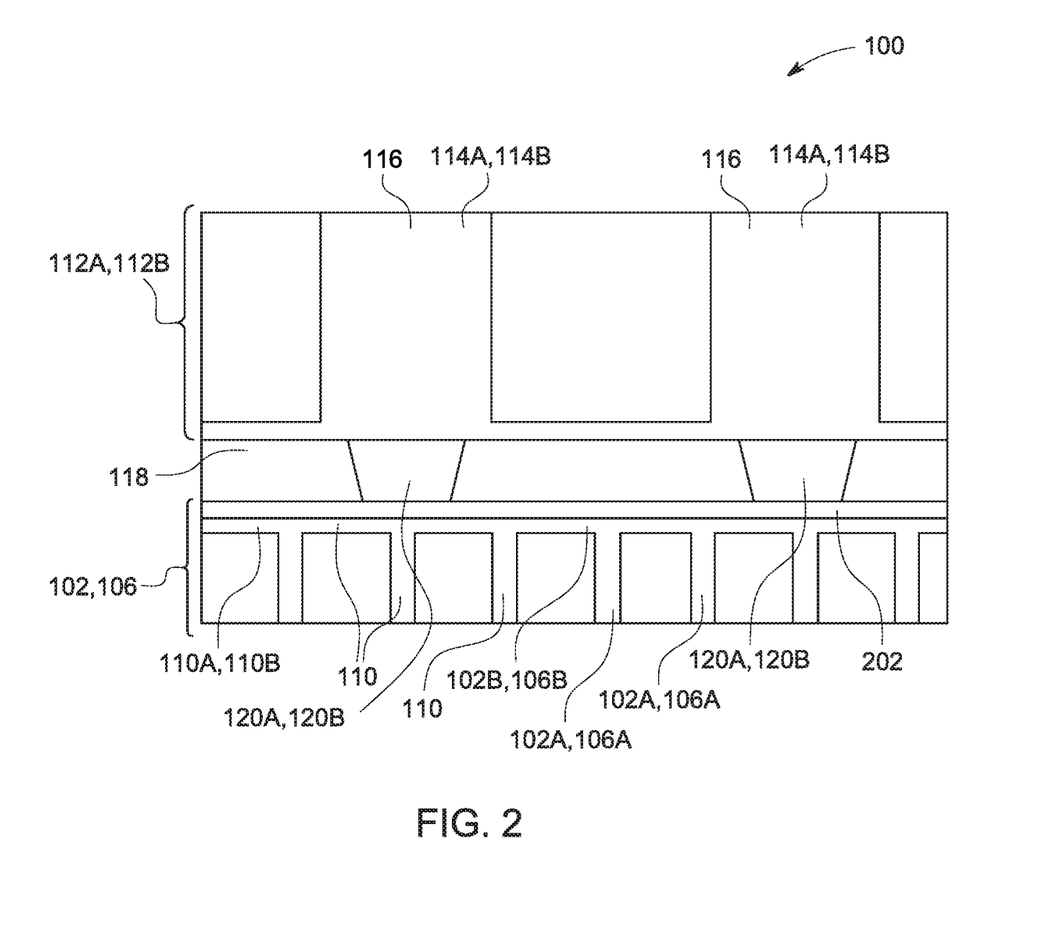
FIG. 2 is a schematic enlarged cross-section view of the quantum mechanical device, according to an embodiment of the present invention.

FIG. 2 is a schematic enlarged cross-section view of the quantum mechanical device 100, according to an embodiment of the present invention. In FIG. 2, same reference numerals indicate same components described above with respect to FIG. 1. Therefore, description of common components will not be repeated in the following paragraphs and only specific features are highlighted. For example, in an embodiment, in addition to substrate handler(s) 112A, 112B, qubit chip 102, interposer 106, bonding material 118 and studs 102A, 120B, the quantum mechanical device 100 further includes a heat spreader material 202. For example, the heat spreader material 202 can be provided between the back side 102B of the qubit chip 102 and the bonding material 118 in contact with the thermally conductive studs 120A. For example, the heat spreader 202 can also be provided between the back side 106B of the interposer 106 and the bonding material 118 in contact with the thermally conductive studs 120B. In this way, the heat spreader 202 is configured to transfer heat from the qubit chip 102, the interposer 106, or both to the substrate handler 112A or the substrate handler 112B, or both.

For example, heat from the qubit chip 102 can be spread out along the back side 102B of the qubit chip 102 by the heat spreader 202 and then transmitted through thermally conductive studs 120A to the plurality of vias 114A in the substrate handler 112A which are filled with non-superconducting heat dissipating material 116. Similarly, heat from the interposer 106 can be spread out along the back side 106B of the interposer 106 by the heat spreader 202 and then transmitted through thermally conductive studs 120B to the plurality of vias 114B in the substrate handler 112B which are filled with non-superconducting heat dissipating material 116.

Figure 3:
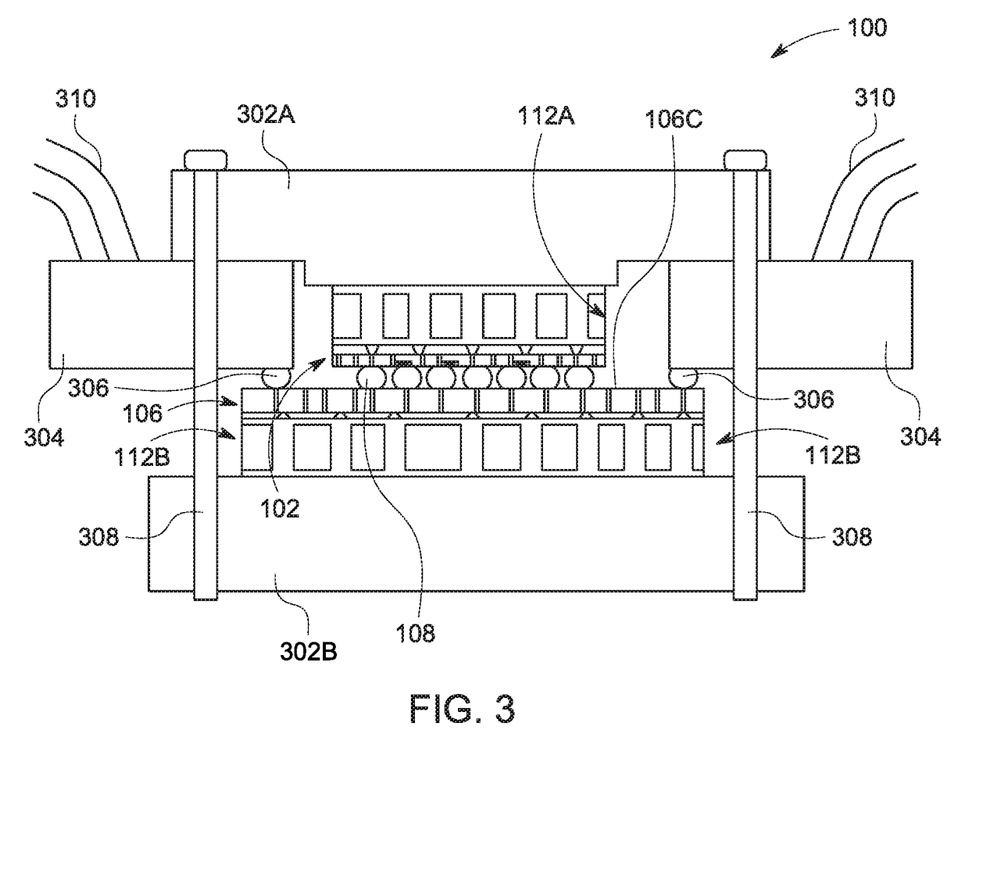
FIG. 3 is a schematic cross-section view of the quantum mechanical device, according to an embodiment of the present invention.

FIG. 3 is a schematic cross-section view of the quantum mechanical device 100, according to an embodiment of the present invention. Similarly, same reference numerals indicate same components described above with respect to FIGS. 1 and 2. Therefore, description of common components will not be repeated in the following paragraphs and only specific features are highlighted. In an embodiment, the quantum mechanical device 100 further includes a heat sink 302A thermally and mechanically in contact with the substrate handler 112A which is thermally in contact with the qubit chip 102. The heat sink 302A is configured to further dissipate heat dissipated by the substrate handler 112A. In an embodiment, the quantum mechanical device 100 further includes a heat sink 302B thermally and mechanically in contact with the substrate handler 112B which is thermally in contact with the interposer 106. The heat sink 302B is configured to further dissipate heat dissipated by the substrate handler 112B.

In an embodiment, the quantum mechanical device 100 further includes an organic substrate 304 attached to and electrically connected to the interposer 106. In an embodiment, the organic substrate 304 is attached and electrically connected to the interposer 106 using a plurality of solder bumps 306. In an embodiment, as shown in FIG. 3, the organic substrate 304 is attached and electrically connected to the front side 106C of the interposer 106 that is attached to and electrically connected to the qubit chip 102. In an embodiment, the organic substrate 304 can be, for example, a laminate.

In an embodiment, the heat sink 302A is further attached to the organic substrate 304 using a plurality of fasteners 308. The fasteners 308 are used to fasten the heat sink 302A, the organic substrate 304 and the heat sink 302B together to form a rigid and sturdy structure. In an embodiment, electromagnetic signal lines, connectors, etc. (e.g., ardent connectors) 310 for carrying electromagnetic signals (e.g., microwave signals) are connected to the organic substrate 304 which is configured to transmit the electromagnetic signals through the solder bumps 306 to the interposer 106.

Figure 4:
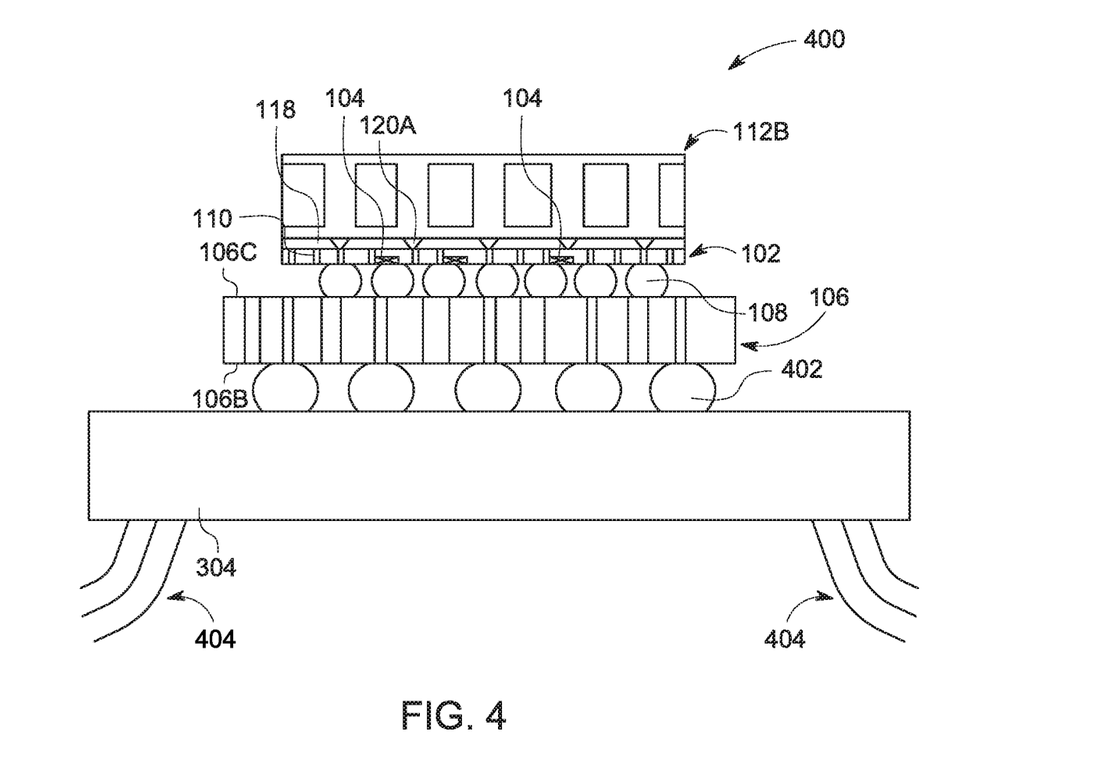
FIG. 4 is a schematic cross-section view of a quantum mechanical device, according to another embodiment of the present invention.

FIG. 4 is a schematic cross-section view of a quantum mechanical device 400, according to another embodiment of the present invention. The quantum mechanical device 400 is similar in many aspects with the quantum mechanical device 100. Therefore, common components are referred to herein using the same reference numerals. Similar to quantum mechanical device 100, the quantum mechanical device 400 includes the qubit chip 102, the interposer 106 and substrate handlers 112A and 112B, etc. In the quantum mechanical device 100, the organic substrate 304 is attached to and electrically connected to the front side 106C of the interposer 106. However, in the quantum mechanical device 400, the organic substrate 304 is instead attached and electrically connected to the back side 106B of the interposer 106. In an embodiment, the organic substrate 304 is attached and electrically connected to the back side 106B of the interposer 106 using solder bumps 402. In an embodiment, electromagnetic signal lines, connectors, etc. (e.g., ardent connectors) 404 for carrying electromagnetic signals (e.g., microwave signals) are connected to the organic substrate 304 which is configured to transmit the electromagnetic signals through the solder bumps 402 to the interposer 106.

Figure 5A:
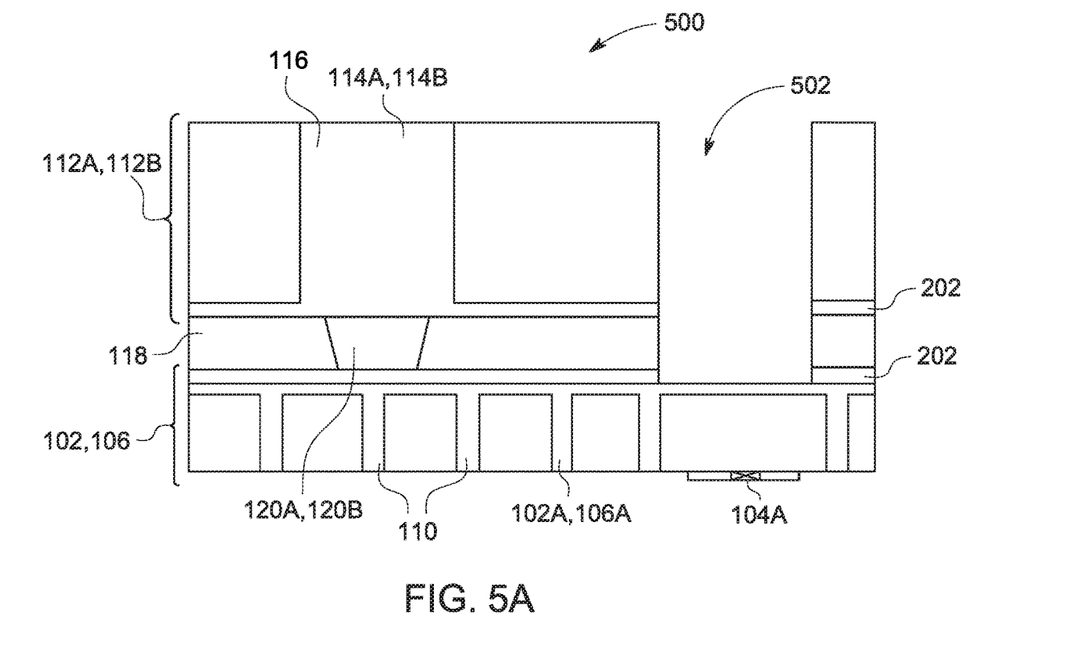
FIG. 5A is a schematic cross-section view of the quantum mechanical device, according to an embodiment of the present invention.

FIG. 5A is a schematic cross-section view of a quantum mechanical device 500, according to an embodiment of the present invention. The quantum mechanical device 500 is similar in many aspects with the quantum mechanical device 100 as shown in FIG. 2, for example. Therefore, common components are referred to herein using the same reference numerals. Similar to quantum mechanical device 100, the quantum mechanical device 400 includes the qubit chip 102, the interposer 106 and substrate handlers 112A and 112B, etc.

As described previously with reference to the quantum mechanical device 100, the substrate handler 112A attached to the qubit chip 102 includes a plurality of vias 114A and the substrate handler 112B attached to the interposer 106 includes a plurality of vias 114B. At least a portion of plurality of vias 114A and/or 114B are filled with a non-superconducting material 116. The non-superconducting heat dissipating material 116 can be selected to dissipate heat generated in the qubit chip 102, the interposer 106, or both. As shown in FIG. 5A, instead of filling some of the vias 114A, 114B with the non-superconducting material 116, some of the vias 114A, 114B are not filled with non-superconducting heat dissipating material 116. In an embodiment, at least one window-via 502 is provided in addition to the vias 114A, 114B that are filled with the non-superconducting material 116.

Figure 5B:
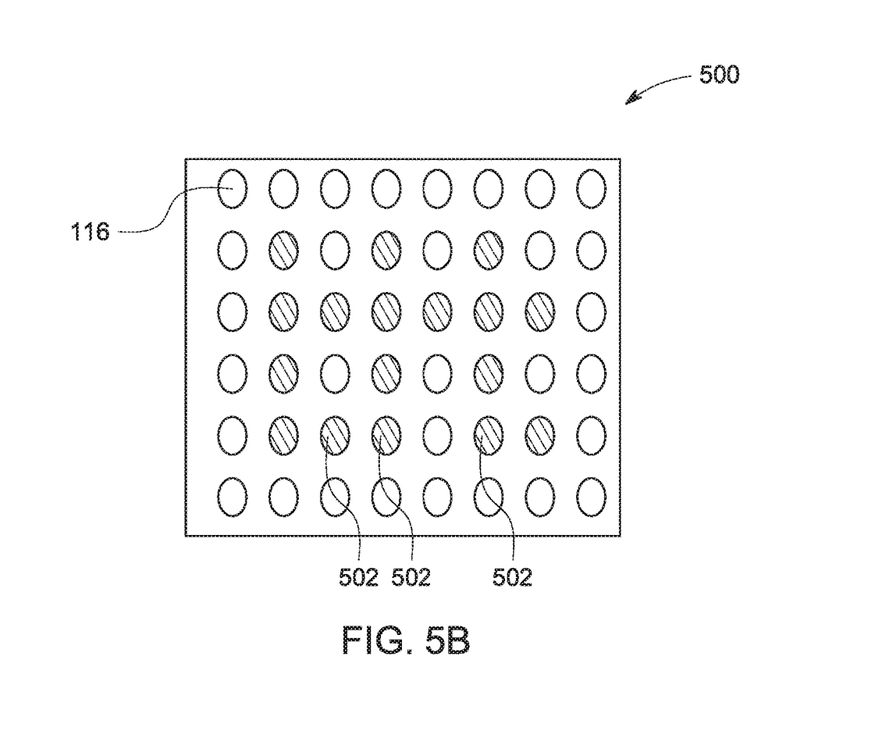
FIG. 5B is a schematic top view of the quantum mechanical device, according to an embodiment of the present invention.

FIG. 5B is a schematic top view of the quantum mechanical device 500, according to an embodiment of the present invention. FIG. 5B shows that some of the vias 114A, 114B are filled with non-superconducting heat dissipating material 116 while some of the vias are left empty and instead at least one window-via 502 is provided therein. The at least window-via 502 is located on a back side 102B, 106B of the qubit chip 102 and interposer 106, respectively, at a location of a qubit 104A in the plurality of qubits 104. As shown in FIG. 5A, the at least one window-via 502 traverses a full depth of the substrate handler 112A, 112B as well as the bonding material 118 and the non-superconducting heat spreader 202. This can enable a laser beam to be transmitted through the at least one window-via 502 to controllably remove a metal layer connected to the qubit 104A and change a capacitance of the qubit 104A.

Figure 6:
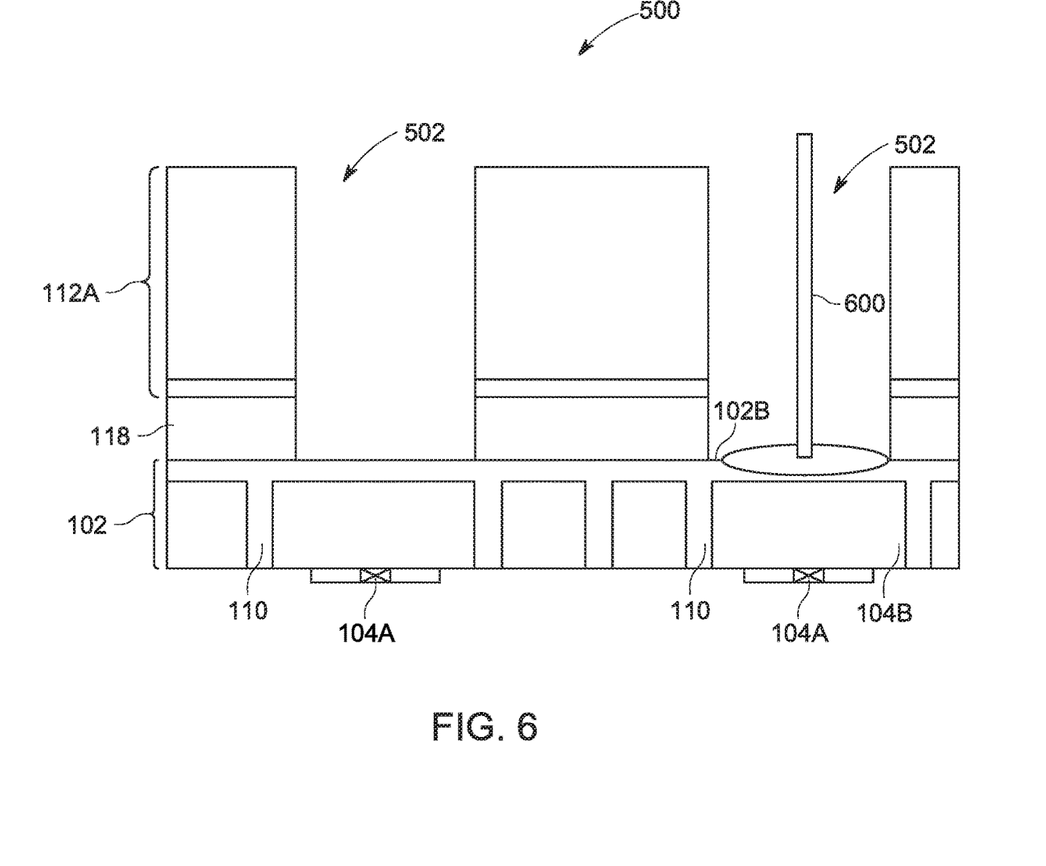
FIG. 6 is a schematic cross-section view of the quantum mechanical device, according to an embodiment of the present invention.

FIG. 6 is a schematic cross-section view of the quantum mechanical device 500, according to an embodiment of the present invention. As shown in FIG. 6, the quantum mechanical device 500 has a plurality of window-vias 502. For example, a laser beam 600 can be transmitted through one of the window-vias 502 to reach the back side 102B of the qubit chip 102 to remove metal from metal layer or superconducting material 110 at or near a qubit pocket 104B where the qubit 104A is mounted. By removing metal at or near the qubit pocket 104B, a capacitance can be changed and thus the frequency of the qubit 104B can be modified as desired.

Figure 7:
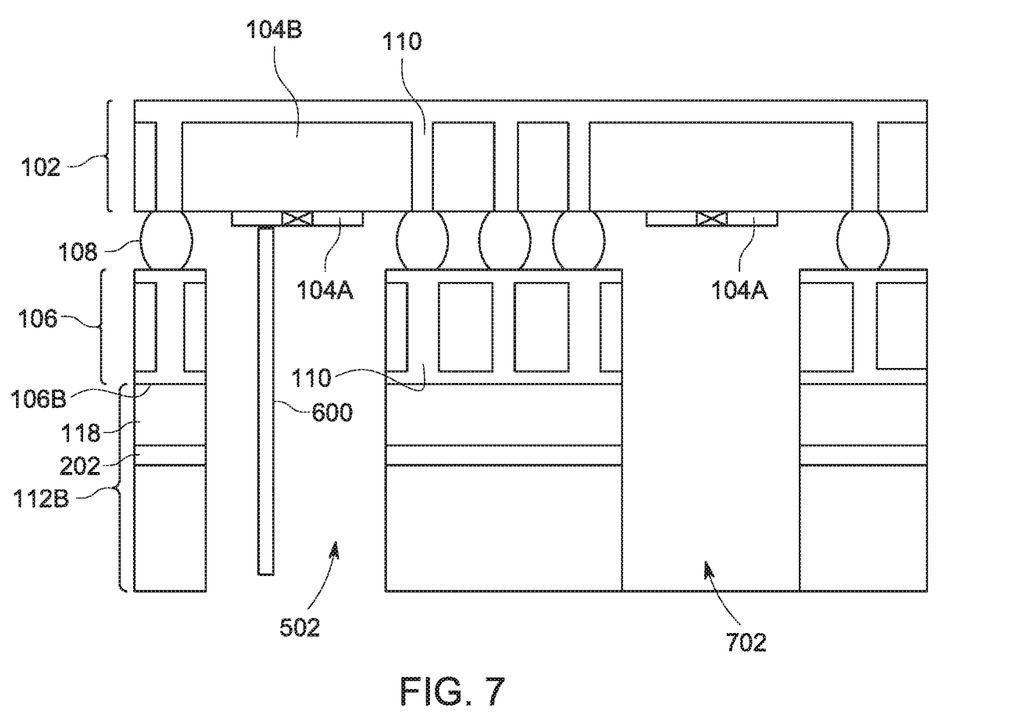
FIG. 7 is a schematic cross-section view of a quantum mechanical device, according to an embodiment of the present invention.

FIG. 7 is a schematic cross-section view of a quantum mechanical device 700, according to an embodiment of the present invention. As shown in FIG. 7, the quantum mechanical device 700 is similar in many aspects to the quantum mechanical devices 100, 400, 500 described in the above paragraphs. Therefore, same reference numerals are used in FIG. 7 to refer to same components. As shown in FIG. 7, in addition to the at least window-via 502 provided within the interposer 106 and the substrate handler 112B attached to the backside 106B of the interposer 106, at least plasma window-via 702 is also provided within the interposer 106 and the substrate handler 112B. However, as illustrated in FIG. 7, the laser beam 600 is used to remove metal or superconducting material from the front side 102C of the qubit chip 102 where the qubit 104A is mounted. In addition, the at least plasma window-via 702 traverses both the interposer 106 and the substrate handler 112B. This enable a plasma to be transmitted through the plasma window-via 702 to qubit chip 104 to, for example, modify or improve coherence.

Figures 8A, 8B:
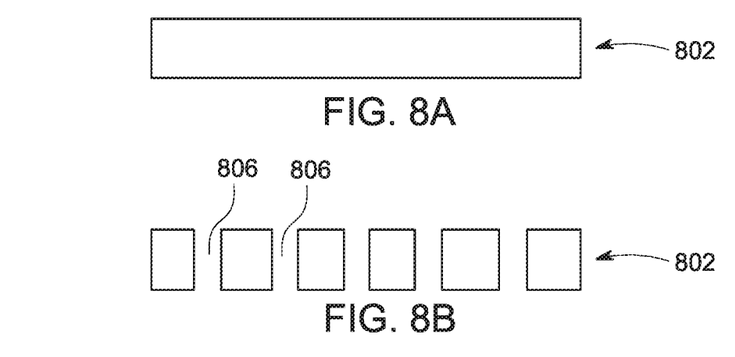
FIGS. 8A-8H show various steps of a method of making the quantum mechanical devices shown in the above Figures, according to an embodiment of the present invention.
Figures 8C, 8D:
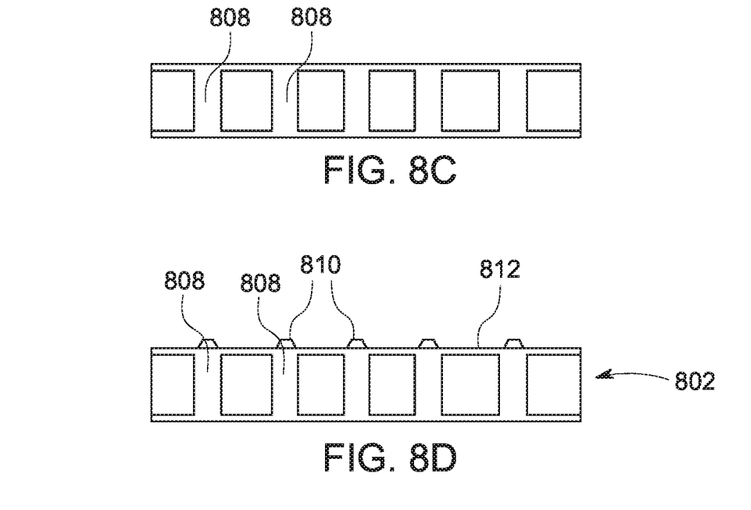
Figures 8E, 8F:
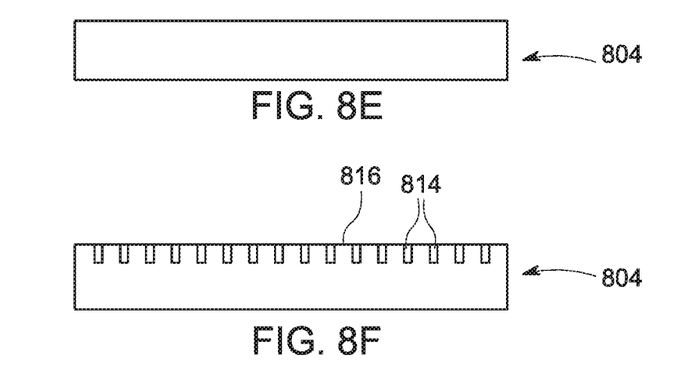

FIGS. 8A-8H show various steps of a method of making the quantum mechanical devices 100, 400, 500, 700 described in the above paragraphs, according to an embodiment of the present invention. The method includes providing a first substrate handler 802 and providing a qubit chip substrate 804, as shown in FIGS. 8A and 8E, respectively. The method further includes forming a plurality of vias 806 through the first substrate handler 802, as shown in FIG. 8B, and filling the plurality of vias 806 with non-superconducting thermally conducting material 808, as shown in FIG. 8C. The method also includes forming a plurality of thermally conductive studs 810 on one side 812 of the first substrate handler 802, as shown in FIG. 8D.

Figures 8G, 8H:
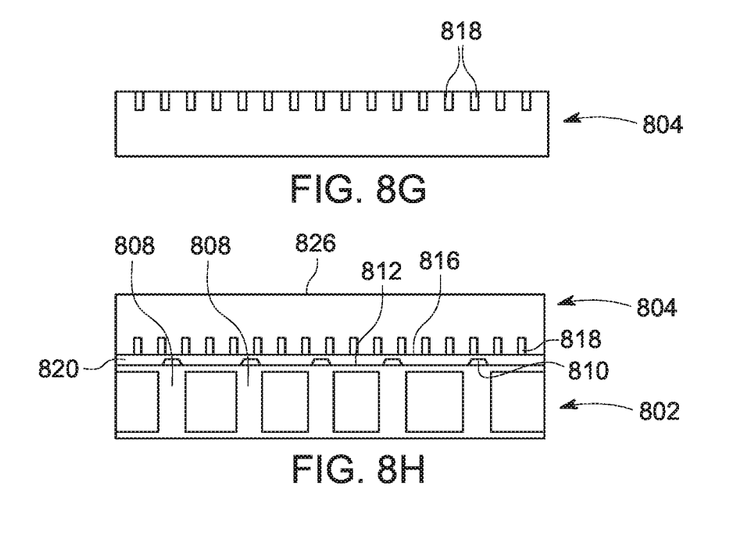

The method further includes forming a plurality of vias 814 in a first face 816 of the qubit chip substrate 804, as shown in FIG. 8F. The method also includes filling the plurality of vias 814 with a superconducting material 818, as shown in FIG. 8G. After filling the plurality of vias 814 with the superconducting material 818, the method includes bonding the first face 816 of the qubit chip substrate 804 to the one side 812 of the first substrate handler 802 having the thermally conductive studs 810, as shown in FIG. 8H.

In an embodiment, bonding the first face 816 of the qubit chip substrate 804 to the one side 812 of the substrate handler 802 having the thermally conductive studs 810 includes bonding using a polymer material, a metal bonding, or an oxide bonding 820, as shown in FIG. 8H.

Figure 9A:
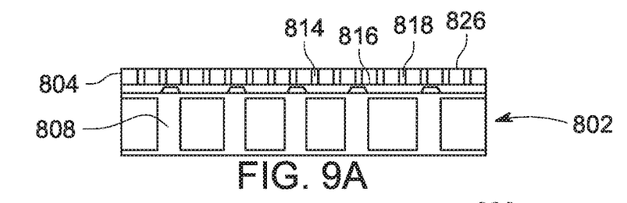
FIGS. 9A-9G show additional steps of the method of making the quantum mechanical devices shown in the above Figures, according to an embodiment of the present invention.
Figure 9B:
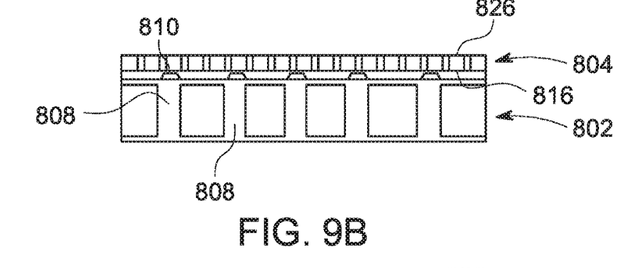
Figure 9C:
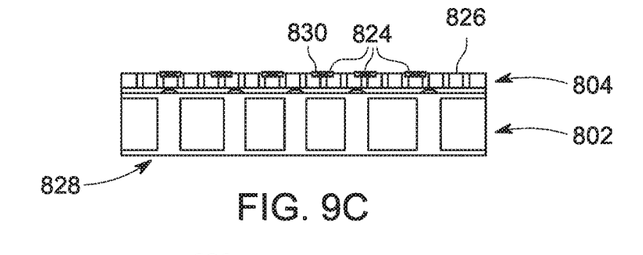

FIGS. 9A-9G show additional steps of the method of making the quantum mechanical devices 100, 400, 500, 700 described in the above paragraphs, according to an embodiment of the present invention. The method further includes grinding a second face 826 of the qubit chip substrate 804, the second face 826 being opposite to the first face 816 until reaching the plurality of vias 814 in the first face 816 of the qubit chip substrate 804, as shown in FIG. 9A. The method further also includes forming capacitors and bus lines on the ground second face 826 using a superconducting material, as shown in FIG. 9B. The method includes forming a plurality of qubits 824 on the ground second face 826 of the qubit chip substrate 804 and connecting the plurality of qubits 824 to the capacitors and bus lines to obtain a qubit chip support structure 828, as shown in FIG. 9C.

Figure 9D:
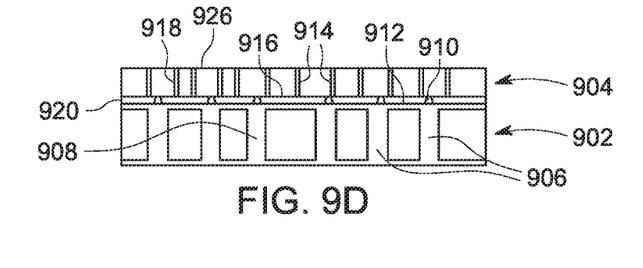

The method includes providing a second substrate handler 902 and providing an interposer substrate 904, as shown in FIG. 9D. In an embodiment, the method includes similar steps to the steps described above with reference to FIGS. 8A-8H and FIGS. 9A-9B which are performed on second substrate handler 902 and interposer substrate 904. For example, the method includes forming a plurality of vias 906 through the second substrate handler 902 and filling the plurality of vias 906 with non-superconducting thermally conducting material 908, as shown in FIG. 9D. The method also includes forming a plurality of thermally conductive studs 910 on one side 912 of the second substrate handler 902, as shown in FIG. 9D. The method includes forming a plurality of vias 914 in a first face 916 of the interposer substrate 904, as shown in FIG. 9D. The method further includes filling the plurality of vias 914 with a superconducting material 918. The method also includes bonding the first face 916 of the interposer substrate 904 to the one side 912 of the second substrate handler 902 having the thermally conductive studs 910. In an embodiment, bonding the first face 916 of the interposer substrate 904 to the one side 912 of the second substrate handler 902 includes bonding using a polymer material, a metal bonding, or an oxide bonding 920, as shown in FIG. 9D.

The method further includes grinding a second face 926 of the interposer substrate 904, the second face 926 being opposite to the first face 916 until reaching the plurality of vias 914 in the first face 916 of the interposer substrate 904, as shown in FIG. 9D. The method also includes forming readout resonators, capacitive coupled lines, and drive lines using a superconducting material on the ground second face 926 of the interposer substrate 904.

Figure 9E:
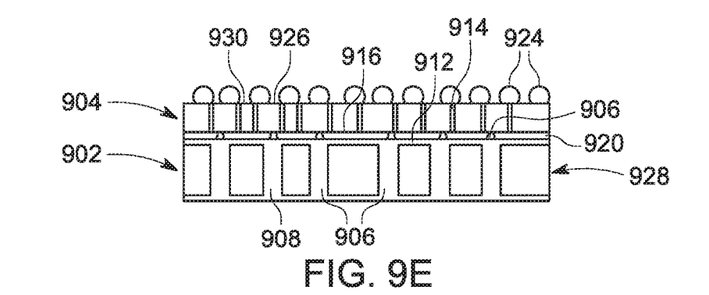

The method includes applying solder bumps 924 on the ground second face 926 of the interposer substrate 904 to obtain an interposer support structure 928, as shown in FIG. 9E. In an embodiment, the method includes contacting a side 830 of the qubit chip support structure 828 having the qubits 824 with a side 930 of the interposer support structure 928 having the solder bumps 924, as shown in FIG. 9F.

Figure 9F:
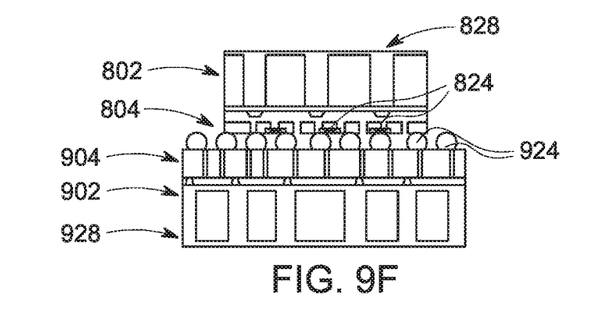
Figure 9G:
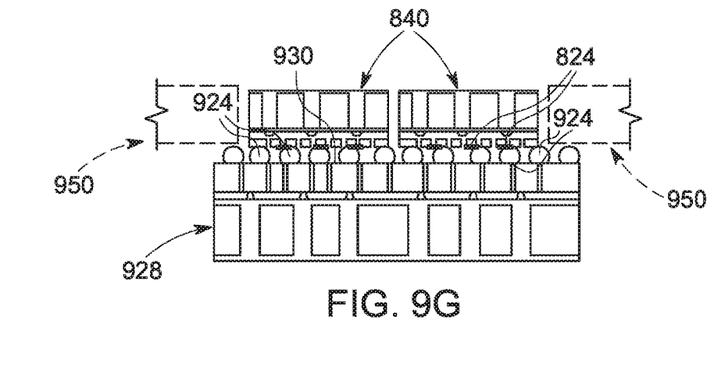

In an embodiment, prior to contacting the side 830 of the qubit chip support structure 828 having the plurality of qubits 824 with the side 930 of the interposer support structure 928 having the solder bumps 924, dicing the qubit support structure 828 having the plurality of qubits 824 into a plurality of qubit chips 840, as shown in FIG. 9G. In an embodiment, the method further includes contacting each of the plurality of qubit chips 840 having the qubits 824 with the side 930 of the interposer support structure 928 having the solder bumps 924, as shown in FIG. 9G. In an embodiment, the method also includes bonding the interposer support structure 928 to an organic substrate 950.

As it can be appreciated, the structures fabricated using the above method(s) and shown in FIGS. 9F and 9G are similar to the quantum mechanical device 100 shown for example in FIG. 1. The present method of making the quantum mechanical devices 100, 400, 500, 700 described in the above paragraphs has many benefits including a relative ease of implementation as well as eliminating unnecessary conventional steps such as removing substrate handler (i.e., de-bonding the substrate handler) in the final structure. In fact, to the contrary the substrate handler can provide additional rigidity to the structure while acting as a heat dissipator.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A quantum device, comprising:
   a qubit chip comprising a plurality of qubits;
   an interposer attached to and electrically connected to the qubit chip;
   a substrate handler attached to one side of the qubit chip or to one side of the interposer, or both so as to be thermally in contact with the qubit chip or the interposer, or both; and
   a substrate attached to and electrically connected to the interposer using a plurality of solder bumps,
   wherein the substrate handler includes a plurality of vias, at least a portion of plurality of vias being filled with a non-superconducting material, the non-superconducting material being selected to dissipate heat generated in the qubit chip, the interposer or both.

2. The quantum device according to claim 1, wherein the interposer is attached to and electrically connected to the qubit chip using solder bumps.

3. The quantum device according to claim 1, further comprising a bonding material, wherein the substrate handler is attached to the one side of the qubit chip or to the one side of the interposer, or both using the bonding material.

4. The quantum device according to claim 3, wherein the bonding material is an adhesive bonding material or a metal or an oxide bonding.

5. The quantum device according to claim 3, wherein the bonding material is selected from the group consisting of: polyimide, benzocyclobutene (BCB), acrylic, Al—Al bonding, In—In bonding, Sn—Sn boding, Au—Sn bonding, Au—In bonding, and Sn—In bonding.

6. The quantum device according to claim 1, further comprising a plurality of thermally conductive studs configured and arranged to thermally connect the substrate handler to the one side of the qubit chip or to said one side of the interposer, or both.

7. The quantum device according to claim 1, further comprising a superconducting material, wherein the qubit chip and the interposer comprise a plurality of vias, at least a portion of said vias being filled with the superconducting material.

8. The quantum device according to claim 7, wherein a back side of the qubit chip opposite to a side having the plurality of qubits has a layer of the superconducting material and a back side of the interposer opposite to a side of the interposer attached to and electrically connected to the qubit chip has a layer of the superconducting material.

9. The quantum device according to claim 1, wherein the substrate handler comprises a plurality of vias, a portion of said plurality of vias being filled with superconducting material and at least one of said plurality of vias being substantially empty to operate as at least one window-via.

10. The quantum device according to claim 9, wherein said at least one window-via is located on a back side of a location of a qubit of said plurality of qubits so as to enable a laser beam to be transmitted through said at least one window-via to controllably remove a metal layer connected to the qubit and change a capacitance of the qubit.

11. The quantum device according to claim 9, wherein the interposer and the substrate handler comprise at least one window-via that traverses both the interposer and the substrate handler so as to enable a laser beam to be transmitted therethrough to a frontside of said qubit to modify said qubit.

12. The quantum device according to claim 9, wherein the interposer and the substrate handler comprise at least one window-via that traverses both the interposer and the substrate handler so as to enable a plasma to be transmitted therethrough to the qubit chip.

13. The quantum device according to claim 1, wherein the interposer comprises a plurality of vias, a first portion of said plurality of vias is filled with superconducting material for ground connection and a second portion of said plurality of vias is filled with superconducting material for signal transmission.

14. The quantum device according to claim 1, further comprising a first heat sink thermally and mechanically in contact with the substrate handler, the first heat sink being configured to further dissipate heat dissipated by the substrate handler.

15. The quantum device according to claim 1, wherein said substrate is an organic substrate.

16. The quantum device according to claim 15, wherein the first heat sink is further attached to the organic substrate.

17. The quantum device according to claim 1, wherein the substrate comprises a laminate.

* * * * *